(12) United States Patent
Araya

(10) Patent No.: US 6,927,477 B2
(45) Date of Patent: Aug. 9, 2005

(54) COPLANAR LINE, AND A MODULE USING THE COPLANAR LINE

(75) Inventor: Yoshihisa Araya, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/637,008

(22) Filed: Aug. 8, 2003

(65) Prior Publication Data

US 2004/0080039 A1  Apr. 29, 2004

(30) Foreign Application Priority Data

Aug. 9, 2002  (JP) ........................................ 2002-233663

(51) Int. Cl.$^7$ .............................................. H01L 39/00
(52) U.S. Cl. ...................................... 257/662; 257/664
(58) Field of Search ................................ 257/662, 664, 257/775, 691, 692

(56) References Cited

U.S. PATENT DOCUMENTS

2002/0181853 A1 * 12/2002 Ido et al. ...................... 385/19
2004/0165840 A1 * 8/2004 Kato et al. ..................... 385/92

FOREIGN PATENT DOCUMENTS

| JP | 6-303010 | 10/1994 |
| JP | P2000-261216 A | 9/2000 |

* cited by examiner

*Primary Examiner*—Phat X. Cao
(74) *Attorney, Agent, or Firm*—McDermott Will & Emery LLP

(57) ABSTRACT

This invention provides a newly designed coplanar line and an optical module or an electrical module using the coplanar line. The coplanar line comprises a signal transmission line and a pair of ground planes, each are arranged both sides of the signal transmission line. The coplanar line comprises three portions. The first portion has a relatively narrow width of the signal transmission line and the distance to the ground planes. The second portion has a relatively wider width of the signal transmission line and the distance to the ground planes, and the third portion smoothly connects the first portion to the second portion. The distance to the ground planes in the third portion has an exponential relation to the width of the signal transmission line thereof.

13 Claims, 7 Drawing Sheets

COPLANAR LINE, AND A MODULE USING THE COPLANAR LINE

BACKGROUND OF THE INVENTION

1. Field of the Invention

This invention relates to a coplanar line and an assembly installing the coplanar line.

2. Related Prior Art

An electrical and an optical package, in which a semiconductor device is assembled, have a coplanar line to connect the device with an outside of the package. The coplanar line comprises a signal line and ground planes disposed in both sides of the signal line. Since intervals between terminals of the semiconductor device is so narrow, for example smaller than a few hundred microns meters, the interval between the signal line and the ground plane must be formed in narrow to match the interval between the terminals of the semiconductor device. On the other hand in the outside of the package, the interval and the width thereof become a few millimeters to take the connection to the motherboard into account. Accordingly, it is necessary for the coplanar line to provide a portion where the width of the signal line and the distance to the ground plane vary gradually from the inside to the outside of the package.

The conventional coplanar line connecting the terminal with relatively narrower interval to that with relatively wider interval has a configuration that the straight line connects the both terminals. However, such configuration may degrade a transmitting characteristic of the signal line due to impedance mismatching of the signal line. One object of the present invention is to provide a coplanar line with a new configuration that suppresses degradation of signal transmission and to provide a module using such coplanar line.

SUMMARY OF THE INVENTION

One aspect of the present invention relates to a coplanar line. The coplanar line comprises a signal line having a width and ground planes arranged in both sides of the signal line. The signal line and the ground plane form a distance therebetween. The coplanar line has a portion where the distance varies exponentially with the width of the signal line.

By setting a relation between the width of the signal line and the distance to the ground plane to be an exponential relation, impedance of the signal line can be maintained to be characteristic impedance, whereby quality of a signal transmitted on the the coplanar line can be prohibited from degradation.

Another aspect of the present invention relates to an optical module comprises an optical semiconductor device, an electrical semiconductor device and a coplanar line. The coplanar line is electrically connected the electronic semiconductor device and has a feature that a distance between the signal line and a pair of ground planes, which sandwiches the signal line therebetween, varies exponentially with a width of the signal line. The electrical signal output from the electronic semiconductor device or entered thereinto is transmitted on the coplanar line, whereby quality of the signal can be prohibited from degradation.

The module may have a substrate and a base made of metal, the coplanar line and the electrical semiconductor device are provided on the substrate, or the module may have a base made of ceramics, the electronic semiconductor device and the coplanar line are provided on the base.

The module may further have another substrate on the first substrate. The optical semiconductor device and another optical parts are provided on another substrate.

The optical semiconductor device may be a photo diode and the electrical semiconductor device is an amplifier for an optical receiving module, while the optical device may be a laser diode and the electrical device is a laser driver for an optical transmitting module.

Another aspect of the present invention relates to an electronic module comprising an electronic semiconductor device and a coplanar line. The coplanar line is electrically connected the electronic semiconductor device and has a feature that a distance between the signal line and a pair of ground planes, which sandwiches the signal line therebetween, varies exponentially with a width of the signal line. The electrical signal output from the electronic semiconductor device or entered thereinto is transmitted on the coplanar line, whereby quality of the signal can be prohibited from degradation.

The electronic module may further include a substrate, the coplanar line and the electronic device are provided thereon.

The module may further include a base made of a metal, the substrate, on which the coplanar line and the electronic device is provided, is provided on the base, whereby quality of the signal can be prohibited from degradation. The substrate may has an opening, thorough which the electrical semiconductor device is directly mounted onto the base.

The module may has another configuration that the electronic device and the coplanar line are directly formed on the base made of a ceramics without any substrate.

DETAILED DESCRIPTION OF PREFERRED EMBODIMENTS

Preferred embodiments of a configuration of coplanar line, that of a transmission module and a package thereof will be described as referring to accompanied drawings.

Figure 1:
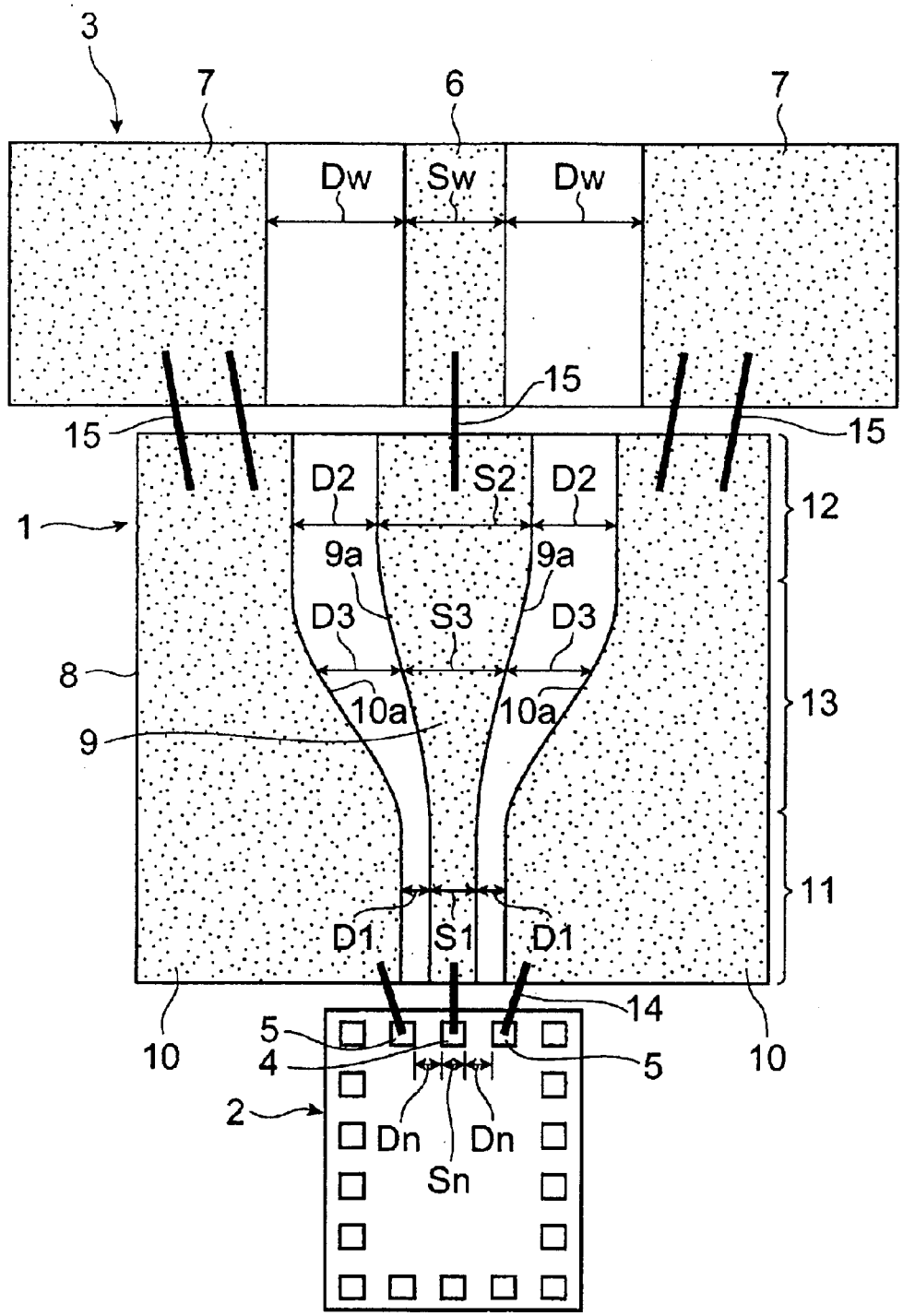
FIG. 1 shows a configuration of a coplanar line according to the present invention.

FIG. 1 shows a plan view showing a configuration of a coplanar line of the present embodiment. In FIG. 1, a substrate 1 of the coplanar line connects a semiconductor device 2 to another substrate 3 placed in the outside of the package.

The semiconductor device 2 has a signal terminal 4 for transmitting a signal, and a pair of ground terminals 5 arranged in both sides of the signal terminal. The substrate 3 has a signal line 6 and a pair of ground planes 7 arranged in both sides of the signal line 6. An distance $D_w$ between the signal line 6 and one of the ground plane 7 at the substrate 3 is greater than an distance between the signal terminal 4 and one of the ground terminal 5 at the semiconductor device. Furthermore, the width $S_w$ of the signal line 6 at the substrate 3 is also greater than that $S_n$ of the signal terminal 4 of the semiconductor device 2.

The substrate 1 for the coplanar line comprises a base 8. On the surface of the base 8, a signal line 9 and a pair of ground planes 10 are arranged. The signal line 9 and ground planes 10 are made of metal such as gold. The substrate 1 comprises three portions. The first portion 11 is adjoined to the semiconductor device 2 where the distance $D_1$ between planes is relatively narrow. The second portion 12 is adjacent to the substrate 3 where the distance $D_2$ is relatively wide. The third portion 13 is arranged between the first portion 11 and the second portion where the distance $D_3$ is gradually changed.

In the first portion 11, the distance $D_1$ between the signal line 9 and the ground plane 10 and the width $S_1$ of the signal line 9 are constant. Typical dimensions of the distance $D_1$ and the width $S_1$ are 0.05 mm and 0.1 mm, respectively. In the second portion 12, the distance $D_2$ between the signal line 9 and the ground plane 10 and the width of the signal line 9 are both constant, typical dimensions of which are 0.35 mm and 0.5 mm, respectively. These dimensions, the distance between the signal line and the ground line and the width of the signal line, are designed so that the impedance $Z_0$ of the signal line matches to 50 Ω. In the third portion 13, the distance $D_3$ between the signal line 9 and the ground plane 10 and the width S3 of the signal line 9 are gradually widen from the first portion 11 to the second portion 12.

In the first portion 11, the signal line 9 and the ground plane 10 are electrically connected to a signal terminal 4 and the ground terminal 5 of the semiconductor device with bonding wires 14. On the other hand, in the second portion 12, the signal line 9 and the ground plane 10 are respectively connected to the signal line 6 and the ground plane 7 with bonding wires 15.

Figure 2:
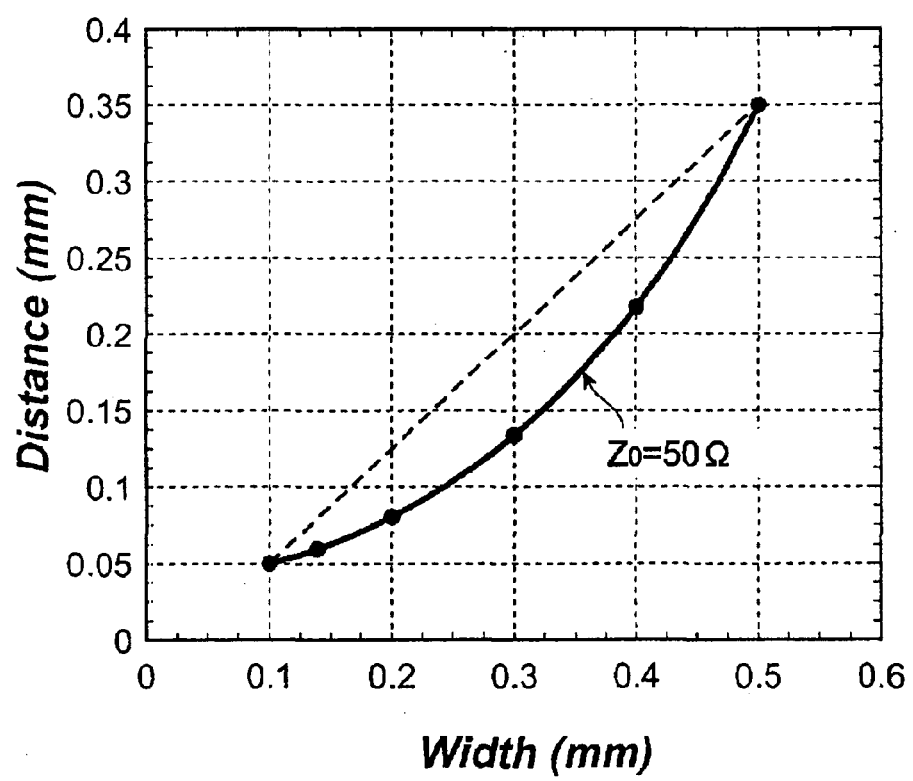
FIG. 2 shows a relation between a width of the signal line and a distance to the ground plane adjacent to the signal line so that impedance becomes 50 Ω.

In such substrate 1, on which the coplanar line is formed, the impedance Z0 in the third portion where the distance and the width of the coplanar line are gradually changed is calculated as shown in FIG. 2. The width x of the signal line to the distance y to the ground plane shows a following exponential relation.

$$y=0.0304*\exp(4.9158*x). \quad (1)$$

In the third portion 13, the configuration of the signal line and the ground plane are designed so that the width of the signal line and the distance to the ground plane satisfy the above relation (1), whereby the impedance at the third portion is set to 50 Ω in spite of the varying the width and the distance.

It is preferable that both edges 9a of the signal line 9 and also both edges 10a of the ground plane 10 are smoothly extended from the first portion 11 to the second portion. 12. Consequently, the distance $D_1$ and the width $S_3$ has the exponential relation as smooth connection at boundaries not only the first portion 12 to the third portion 13 but also that of the second portion 12 to the third portion 13, which enables to keep the characteristic impedance of nearly 50 Ω at respective boundaries and suppresses degradation of the transmission characteristic of the signal line.

Figure 3A:
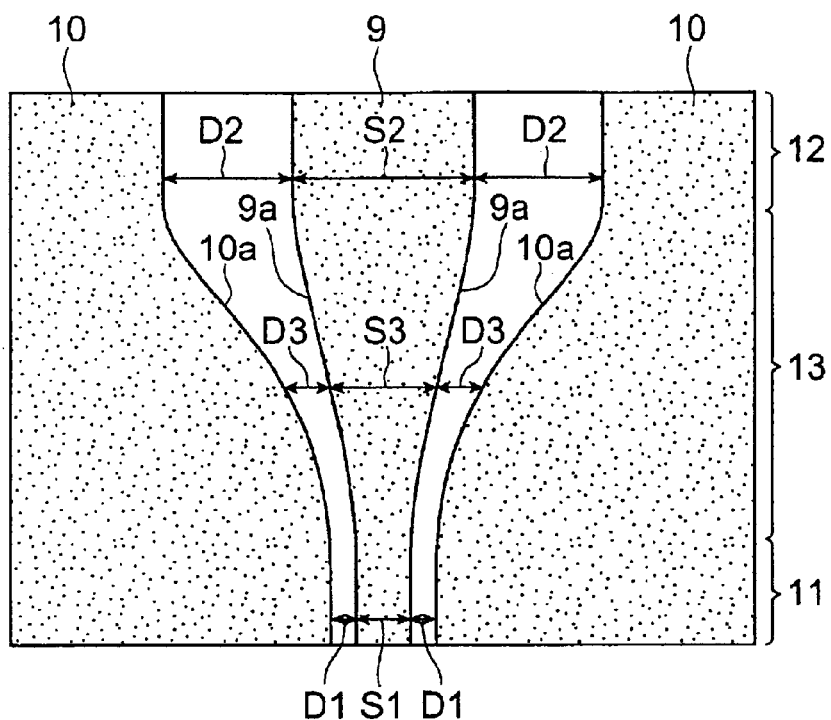
FIG. 3 compares the coplanar line of the present invention to the conventional one.
Figure 3B:
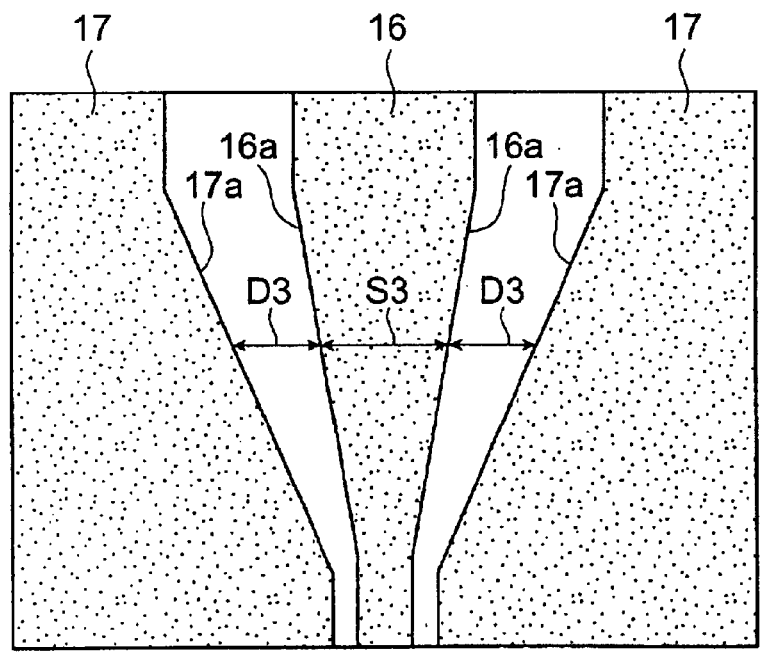

Next, the coplanar line 1 of the present embodiment shown in FIG. 3A will be compared to a conventional coplanar line shown in FIG. 3B. In the configuration of the conventional coplanar line, both edges 16a of the signal line 16 and both edges 17a of the ground plane 17 have straight lines. Therefore, the relation of the width $S_3$ of the signal line 16 to the distance $D_3$ to the ground plane 17 is denoted by a linear function shown in FIG. 2, which causes a impedance mismatching.

Figure 4:
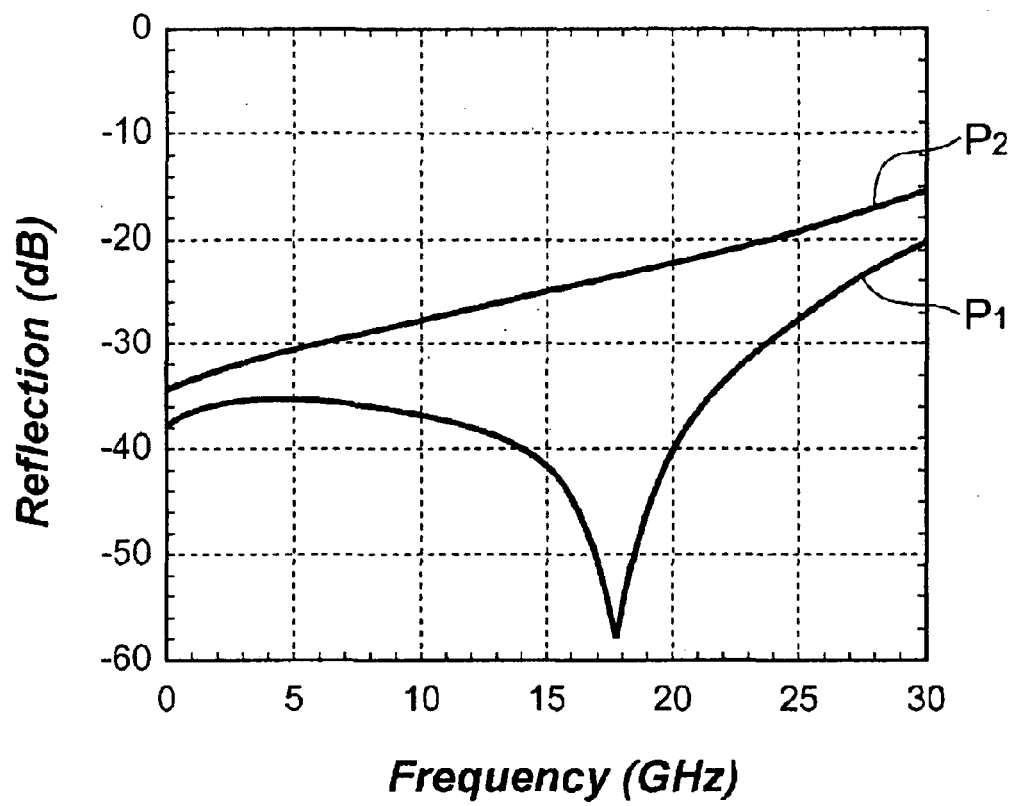
FIG. 4 compares a reflection characteristic of the coplanar line according to the present invention to a conventional line.

FIG. 4 shows a simulative result of the reflection characteristic of the coplanar line. This reflection characteristic simulates the case that the signal with an input power is entered from the first portion with a relatively narrower width and is reflected at the boundary of the first portion to the third portion and also that of the third portion to the second portion. The ordinate denotes a ratio of the reflected power to the incident power.

The configuration of the coplanar line in FIG. 4, a thickness and a dielectric constant of the substrate are 0.6 mm and 8.5, respectively. The substrate is made of an aluminum oxide. The curve $P_1$ in FIG. 4 corresponds to the present embodiment of FIG. 3A, while the curve $P_2$ corresponds to the conventional coplanar line of FIG. 3B.

As shown in FIG. 4, the characteristic of the present coplanar line of FIG. 3 is improved in the reflection characteristics as compared to that of the conventional coplanar line of FIG. 3B. In frequencies around 18 GHz, the reflection characteristic is considerably improved with a resonant dip. Such a behavior of the reflection characteristic may depend on the dimension of the coplanar line and the substrate and the material, especially the dielectric constant, of the substrate. Therefore, the reflection characteristic of the coplanar line can be improved at optional frequencies by adjusting the dimension not only of the coplanar line but also the substrate and the material of the substrate.

Figure 5:
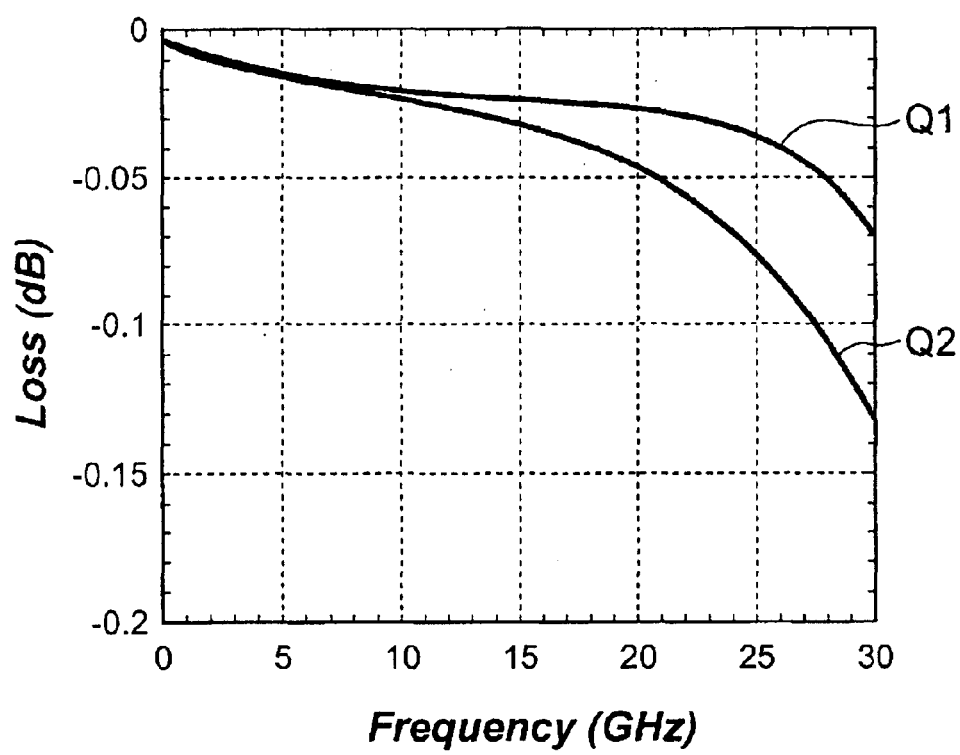
FIG. 5 compares a calculated transmission loss of the coplanar line of the present invention to the conventional line.

FIG. 5 shows a simulative result of the insertion loss of the coplanar line. This characteristic correspond the case when the input signal with an incident power is entered from the edge of the first portion and is output with an output power from the edge of the second portion. The ordinate denotes the ratio of the output power to the incident power. The configuration of the substrate, such as the thickness, the dielectric constant and the material, are same with the case shown in FIG. 4. The curve $Q_1$ in FIG. 5 corresponds to the present embodiment of FIG. 3A, while the curve $Q_2$ denotes the conventional coplanar line of FIG. 3B.

From FIG. 5, the coplanar line of the present embodiment improves in the insertion loss as compared with that of the conventional coplanar line. In the figure, the insertion loss $Q_1$ of the present coplanar line of FIG. 3A shows a superior characteristic to the conventional one as signal frequencies increases. Therefore, the coplanar line of the present embodiment may be applicable to the transmission line, in which signal with higher frequencies is transmitted.

Figure 6:
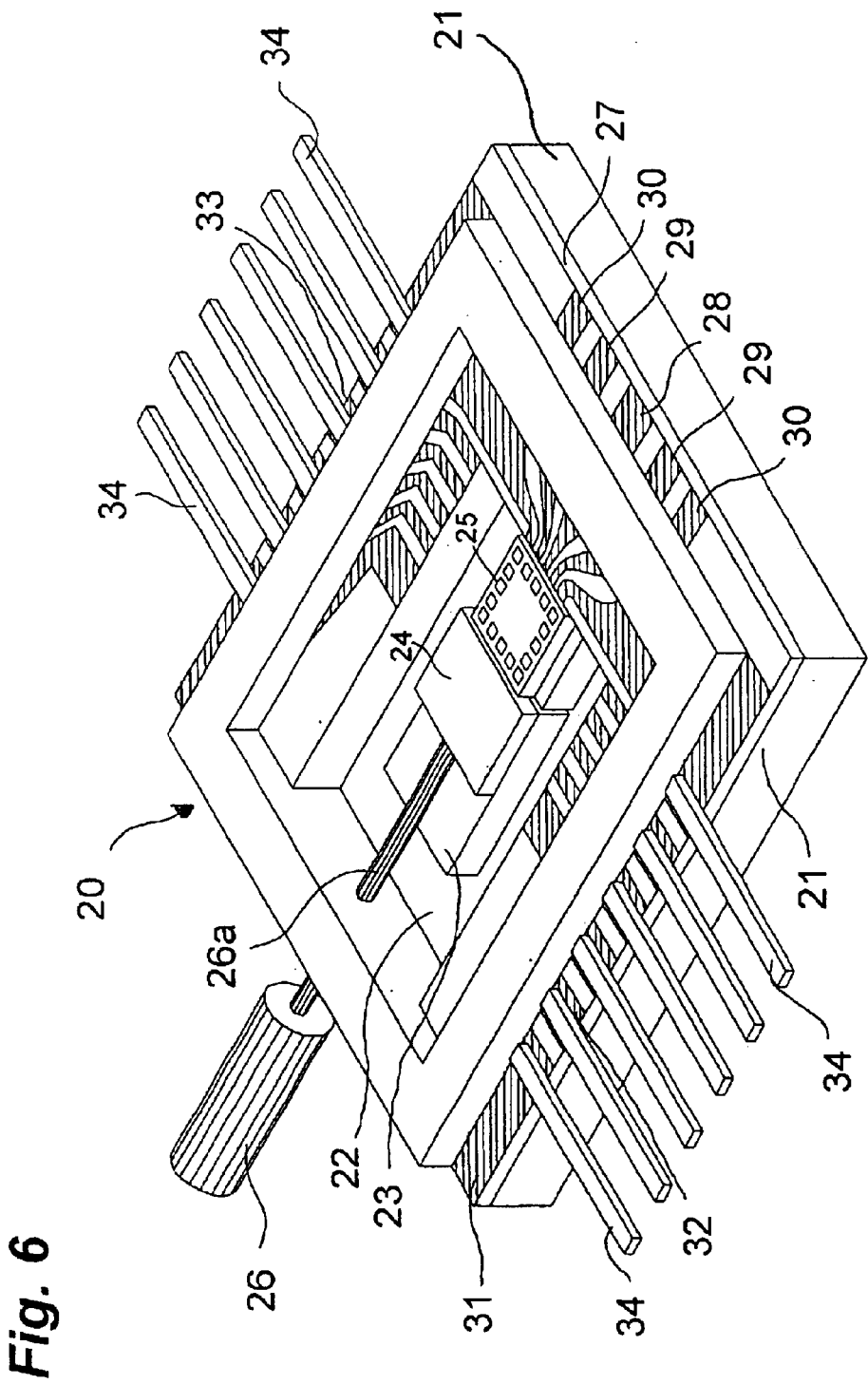
FIG. 6 is an optical module using the coplanar line of the present invention.

FIG. 6 is a plan view showing an optical module that uses the coplanar line of the present invention. In FIG. 6, the optical module 20 has a base 21 made of a metal with a substantial rectangular shape, on which the substrate 27 is disposed. The substrate 31 provides another substrate 22 thereon. On another substrate 22, some optical parts, such as a fiber-fixing member 23, a light-receiving device (photo diode) 24, and some electrical parts, such as an amplifier 25 are installed. In FIG. 6, the substrate 27 and the base 21 are independent to each other and the size of the substrate 27 is substantially equal to that of the base 21 in this embodiment. However, it may be applicable that the base 21 made of a ceramics has a function of the substrate 27 described below.

The fiber-fixing member 23 fixes the bared fiber 26a after aligning to the photo diode 24. The photo diode 24 receives signal light emitted from the optical fiber 26 and converts it to a corresponding electrical signal. The amplifier 25 amplifies the electrical signal from the photo diode and outputs the amplified signal to the outside of the module.

The coplanar line is provided on one side of the substrate 27. The coplanar line has a ground plane 28, a pair of signal lines 29 disposed on the both side of the ground plane 28 and another ground planes formed outside of the respective signal lines. The signal lines 29 and ground planes 28, 29 have a portion where the distance from the signal line 29 to the ground plane varies exponentially with the width of the signal line 29. The substrate 27 has two coplanar configuration previously described in the first embodiment, as the ground plane 28 is a common for each signal line. Therefore, the optical module shown in FIG. 6 enables to operate in stable at signal frequencies over 1 GHz.

The substrate 27 provides ground plane 31, a plurality of power lines 32 and a plurality of monitor lines 33. These planes and lines have respective lead terminals 34. Although not shown explicitly in FIG. 6, the amplifier 25 is connected to the signal lines 29, the power lines 32, and monitor lines 33 with bonding wires made of gold. A power to operate the amplifier 25 is supplied from the outside of the package through the lead terminal 34 and the power line 32. The output of the amplifier 25 is sent to the outside through the signal line 29. The monitored signal is also sent to the outside thorough the monitor line 33 and the lead terminal 34.

Although in FIG. 6, the base 21 and the substrate 27 are formed independently to each other, it may be applicable that, when the base is made of a ceramics, the coplanar line is formed directly on the base without the substrate.

Figure 7:
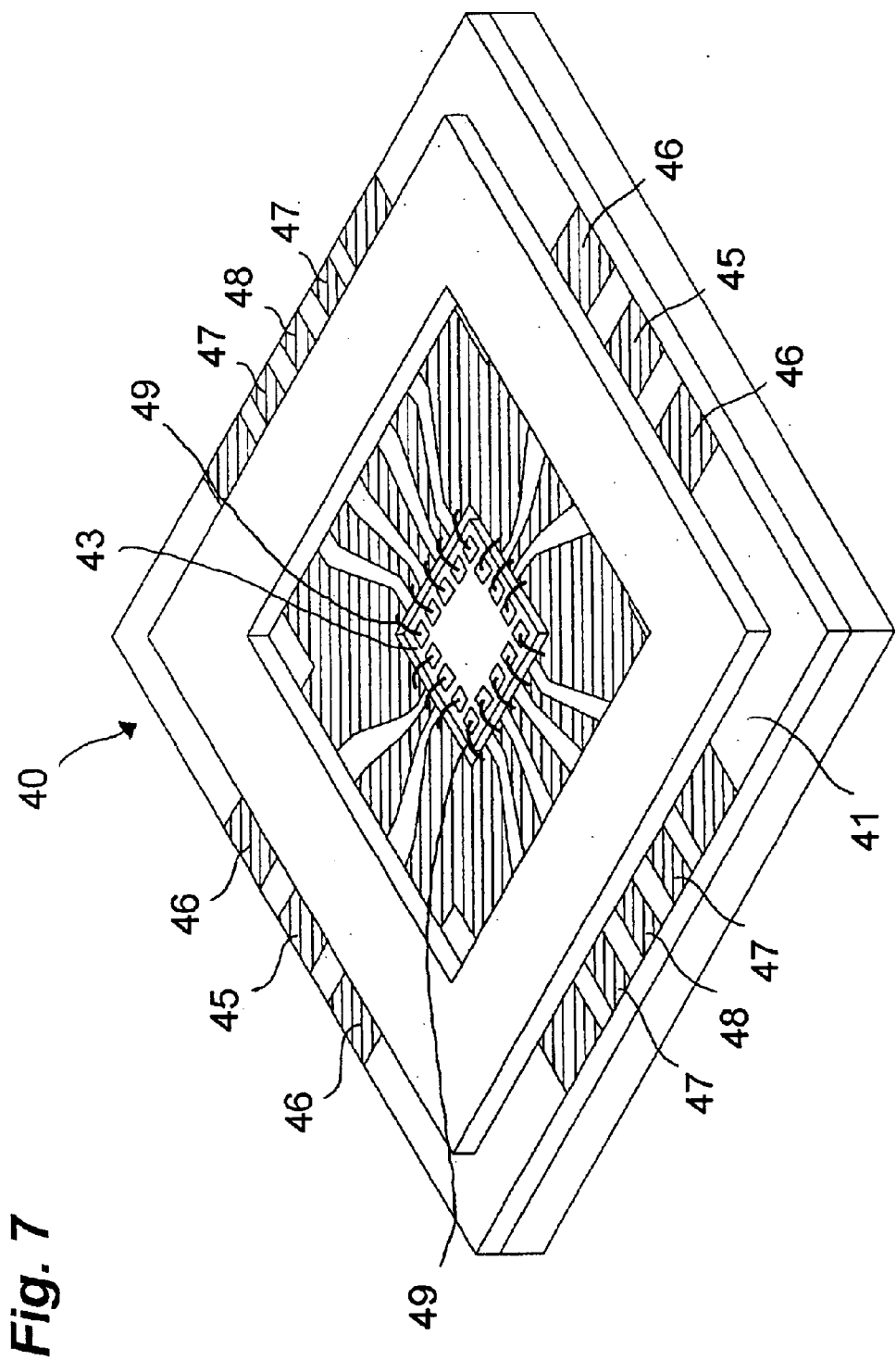
FIG. 7 is an electronic module using the coplanar line according to the present invention.

FIG. 7 shows another embodiment of the present invention, which is a plan view of an electrical module 40. The module 40 in FIG. 7 has a base 41 made of a metal, on which a substrate 42 is provided. The amplifier 43 is installed on the substrate 42. In FIG. 7, although the base 41 and the substrate 42 are formed independently to each other, it may be applicable that, when the base is made of a ceramics, the amplifier 43 and the coplanar line described below are formed directly on the base 41.

The substrate 42 has signal lines 45 and ground planes 46 on both sides of the signal lines 45. A portion of the signal line has a relation that the distance to the ground planes 46 varies exponentially with the width of the signal line 45. The substrate also has power lines 47 and monitor lines 48. The amplifier 43 is connected to the signal line 45, the ground plane 46, the power line 47 and the monitor line 48 with bonding wires made of gold, whereby the electric power to operate the amplifier is supplied from the outside through the power line 47. A signal transmitted from the outside through one of the signal line 45 is amplified by the amplifier 43 and sent to the outside through the other signal line 45. The monitor signal generated by the amplifier 43 is also sent to the outside through the monitor line 48.

Although the amplifier 43 is provided on the substrate 42, the amplifier 43 is installed directly on the base 41. Namely, the substrate 42 has an opening and the amplifier 43 is mounted on the base 41 through the opening, whereby heat dissipation from the amplifier 43 to the base 41 may be effective.

From the embodiment thus described, it will be obvious that the invention and its application may be varied in many ways. For example, the coplanar line in embodiments has curved configuration in both edges of the signal line 9a and the ground plane 10a facing to the signal line 9a. The invention is not restricted to such configuration; namely, one of the signal line 9a and the ground plane 10a may be a straight configuration as far as the distance to the ground plane and the width of the signal line maintains an exponential relation.

Moreover, the coplanar line previously described has constant impedance of 50 Ω as a characteristic impedance $Z_0$. However, the coplanar line may be applicable that the distance $D_3$ to the ground plane varies exponentially with the width $S_3$ of the signal line so as to maintain the impedance thereof to be 75 Ω. Furthermore, although only the light-receiving module and the amplifying-module are shown for an exemplary application of the present coplanar line, another transmission module, such as a light-emitting module, may be applicable for the present invention.

Such variations are not to be regarded as a departure from the spirit and scope of the invention, and all such modifications as would be obvious to one skilled in the art are intended for inclusion within the scope of the following claims.

What is claimed is:

1. A coplanar line having a signal line and a ground plane arranged in both sides of the signal line with a distance thereto, wherein
   the signal line has a width, and
   the coplanar line has a portion where the distance between the signal line and the ground plane varies exponentially with the width of the signal line.

2. An optical module, comprising:
   an optical semiconductor device;
   an electrical semiconductor device; and
   a coplanar line including a signal line and a pair of ground planes arranged in both sides of the signal line with a distance thereto, the signal line having a width, and the coplanar line being electrically connected to the electrical semiconductor device,
   wherein, the coplanar line has a portion where the distance between the signal line and the ground plane varies exponentially with the width of the signal line.

3. The optical module according to claim 2, further comprises a first substrate for providing the coplanar line and the electrical semiconductor device thereon.

4. The optical module according to claim 3, further comprises a second substrate for providing the optical semiconductor device thereon,
   wherein the second substrate is provided on the first substrate.

5. The optical module according to claim 3, further comprises a metal base for providing the first substrate thereon.

6. The optical module according to claim 2, further comprises a base made of ceramics for providing the coplanar line and the electrical semiconductor device thereon.

7. The optical module according to claim 2, wherein the optical semiconductor device is a photodiode for generating an electrical signal and the electrical semiconductor device is an amplifier for amplifying the electrical signal, the amplified electrical signal being output to an outside of the module through the coplanar line.

8. The optical module according to claim 2, wherein the optical semiconductor device is a laser diode and the electrical semiconductor device is a driver for receiving an electrical signal and driving the laser diode, the electrical signal being input from an outside of the module through the coplanar line.

9. An electrical module, comprising
   an electrical semiconductor device; and
   a coplanar line including a signal line and a pair of ground planes arranged in both sides of the signal line with a distance thereto, the signal line having a width, and the coplanar line being electrically connected to the electrical semiconductor device, wherein, the coplanar line has a portion where the distance between the signal line and the ground plane varies exponentially with the width of the signal line.

10. The electrical module according to claim 9, further comprises a substrate for providing the coplanar line and the electrical semiconductor device thereon.

11. The electrical module according to claim 10, further comprises a base made of a metal, the substrate being provided on the base.

12. The electrical module according to claim 9, further comprises a base made of a metal and a substrate for providing the coplanar line thereon, wherein the substrate has an opening, the electrical semiconductor device being mounted on the base via the opening therethrough.

13. The electrical module according to claim 9, further comprises a base made of a ceramics for providing the coplanar line thereon.

* * * * *